United States Patent [19]

Slack

[11] Patent Number: 4,574,252

[45] Date of Patent: Mar. 4, 1986

[54] CONSTANT RISE AGC DEVICE

[75] Inventor: Robert A. Slack, San Diego, Calif.

[73] Assignee: The United States of America as represented by the Secretary of the Navy, Washington, D.C.

[21] Appl. No.: 715,992

[22] Filed: Mar. 25, 1985

[51] Int. Cl.[4] .............................................. H03G 3/20
[52] U.S. Cl. .................................... 330/281; 330/278
[58] Field of Search ............... 330/278, 279, 280, 281, 330/285; 343/7 AG

[56] References Cited

U.S. PATENT DOCUMENTS

| | | | |
|---|---|---|---|
| 3,620,631 | 11/1971 | Stopka | 330/281 |
| 3,678,393 | 7/1972 | Newell | 330/141 |
| 4,233,604 | 11/1980 | Lepere | 343/7 AG |
| 4,292,598 | 9/1981 | Yasumura | 330/281 |

*Primary Examiner*—James B. Mullins
*Assistant Examiner*—G. Wan
*Attorney, Agent, or Firm*—Robert F. Beers; Ervin F. Johnston; Thomas Glenn Keough

[57] ABSTRACT

The invented device provides automatic gain control (AGC) of incoming signals over a large dynamic range of input levels with a constant rise time. The constant rise AGC device includes a primary AGC loop for receiving the incoming or input signal and splitting the input signal to input and output components of the primary AGC loop. The input signal to the input component is processed within the primary AGC loop to control the gain of the input signal at the output component of the primary AGC loop. The primary AGC loop has a slow detector. A secondary AGC loop is provided within the primary AGC loop, and this secondary AGC loop includes the aforementioned input component and has its output connected to the slow detector. The secondary AGC loop has a fast detector for preventing self-imposed saturation. With this arrangement the secondary AGC loop can be utilized to provide a constant AGC buildup signal for any input signal which is greater than a predetermined dB range, and the remainder of the primary AGC loop, which receives the constant AGC buildup signal from the secondary AGC loop, can be optimized for desired rise and fall times so that the latter's output signal can be relatively unaffected by interference bursts, signal gaps, and fading in the input signal.

10 Claims, 6 Drawing Figures

CONSTANT RISE AGC DEVICE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present device provides automatic gain control of input signals, such as incoming RF signals, over a large dynamic range of input levels with a constant rise time.

The normal method for providing automatic gain control is to feed an AGC amplifier an input signal from the output of an IF amplifier and apply the AGC voltage back to the IF amplifier. The result is that input signal levels, which are greater than a small set value, saturate the AGC and IF amplifiers. Consequently the AGC amplifiers do not know the true value of the incoming input signal and cannot anticipate how much AGC to develop. All high levels of the incoming input signal appear approximately the same due to saturation. The result is that the AGC builds up differently for different input signal levels.

SUMMARY OF THE INVENTION

In order to overcome the aforementioned problem associated with prior art AGC devices the present invention provides a primary AGC loop which splits an input signal so that the input signal is received at input and output components of the primary AGC loop. The input signal to the input component is processed within the primary AGC loop to control the gain of the input signal at the output component of the primary AGC loop. The primary AGC loop has a slow detector. A secondary AGC loop is provided within the primary AGC loop, the secondary AGC loop including the input component and having its output connected to the slow detector. The secondary AGC loop has a fast detector for preventing self-imposed saturation. With this arrangement the secondary AGC loop can be utilized to provide a constant AGC buildup signal for any input signal which is greater than a predetermined dB range. The remainder of the primary AGC loop, which receives the constant AGC buildup signal from the secondary AGC loop, can be optimized for desired rise and fall times so that the output signal therefrom can be relatively unaffected by interference bursts, data gaps, and fading in the input signal.

OBJECTS OF THE INVENTION

An object of the present invention is to overcome the problems associated with prior art AGC devices.

Another object of the invention is to provide an AGC device which will produce automatic gain control of input signals, such as incoming RF signals, over a large dynamic range of input levels with a constant rise time.

Other objects, advantages and novel features of the invention will become apparent from the following detailed description of the invention when considered in conjunction with the accompanying drawings.

DESCRIPTION OF THE PREFERRED EMBODIMENT

Figure 1:
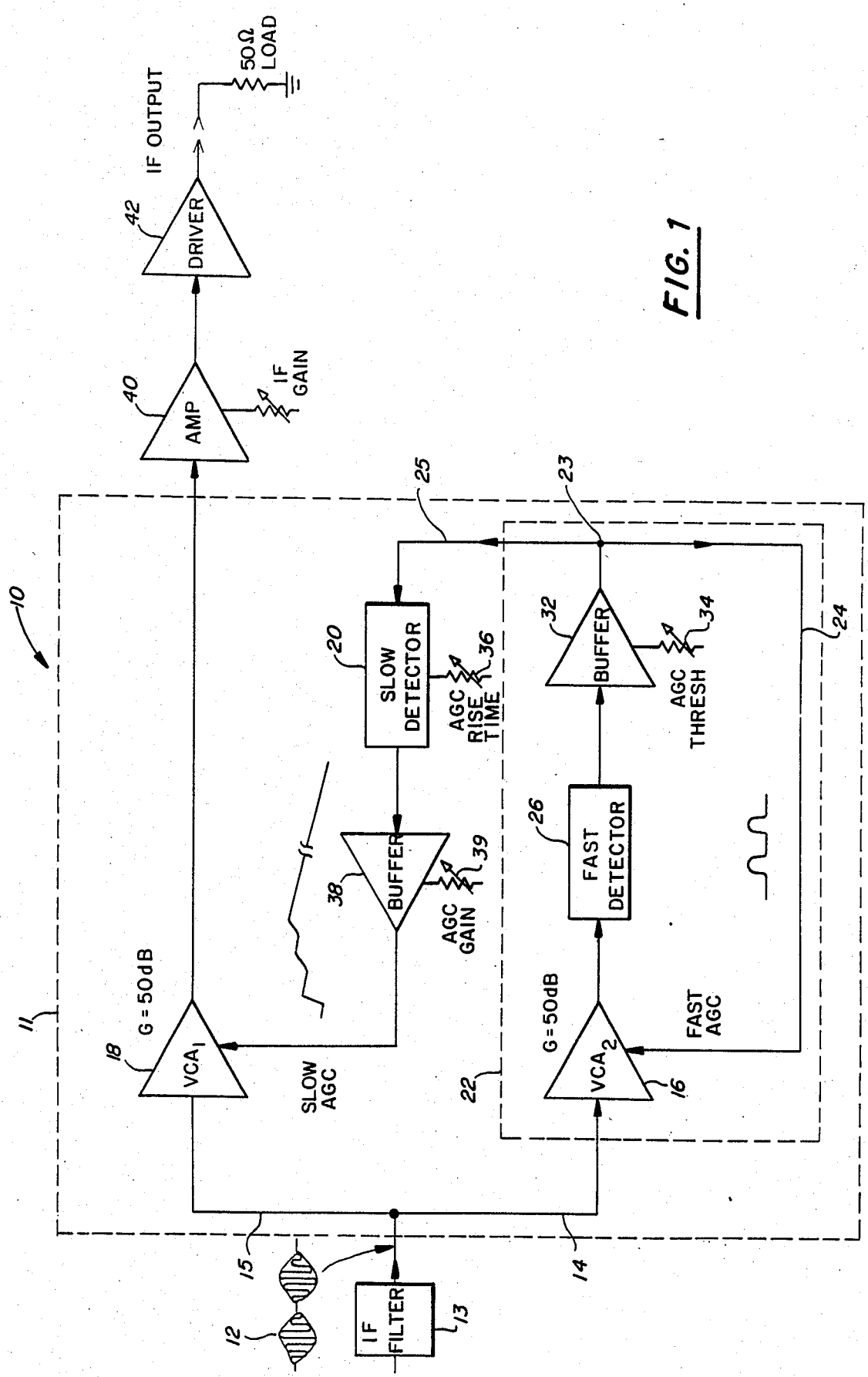
FIG. 1 is a block diagram of the present constant rise AGC device.

Referring now to the drawings wherein like reference numerals designate like or similar parts throughout the several views, there is illustrated in FIG. 1 a constant rise AGC device 10 which includes a primary AGC loop 11 for receiving an input signal, such as an RF signal 12 from an IF amplifier 13. The primary AGC loop 11 splits the input signal via leads 14 and 15 to input and output components 16 and 18, respectively, of the primary AGC loop. The input signal 12 to the input component 16 is processed within the primary AGC loop 11 to control the gain of the input signal at the output component 18 of the primary AGC loop. The primary AGC loop is provided with a slow detector 20.

A secondary AGC loop 22 is provided within the primary AGC loop 11. The secondary AGC loop includes the input component 16 and has its output split at 23 for feedback to the input component 16 via lead 24 and for connection to the slow detector 20 via lead 25. The secondary AGC loop 22 is provided with a fast detector 26 for preventing saturation of the input component 16. The fast detector 26 has a time constant which is faster than the rise time of the IF filter 13 outputting the input signal 12. With this arrangement the secondary AGC loop 22 can be utilized to provide a constant AGC buildup signal for any input signal greater than a predetermined dB range. The remainder of the primary AGC loop 11, which receives the constant AGC buildup signal from the secondary AGC loop 22, can be optimized for desired rise and fall times so that the latter's output signal can be relatively unaffected by interference bursts, data gaps, and fading in the input signal.

In the preferred embodiment the primary AGC loop 11 includes a pair of voltage control amplifiers 16 and 18, the voltage control amplifier 16 being in the secondary AGC loop 22 as illustrated in FIG. 1. The voltage control amplifier 16 of the secondary AGC loop 22 is the input component of the primary AGC loop 11, and the other voltage control amplifier 18 is the output component of the primary AGC loop 11. The voltage control amplifiers 16 and 18 should be identical circuits and preferably identical integrated circuits for reasons to be set forth hereinafter. A buffer 32 may be provided in the secondary loop 22 between the fast detector 26 and the input voltage control amplifier 16, the buffer 32 having an AGC threshold setting 34 for establishing the level at which automatic gain control voltage is applied to the voltage control amplifier 16 and to the slow detector 20.

The slow detector 20 may be provided with means 36 for controlling rise time. The rise time controlling means 36 may be adjusted for rise time which reduces the effects of interference bursts in the input signal 12. Fall time is controlled by a constant current source capacitive discharge circuit in the slow detector 20, which maintains AGC between input signals, but yet will follow any input signal fading. The constant current source discharge will maintain a constant fall time for all input signal levels, and can be adjusted to optimize performance for any given system.

A buffer 38 may be provided between the slow detector 20 and the output voltage control amplifier 18. This buffer 38 is provided with means 39 for controlling gain and can be adjusted to equalize the level of the voltage controlling the voltage control amplifier 18 with the level of the voltage controlling the voltage control amplifier 16. The output of the primary AGC loop 11 at voltage control amplifier 18 is fed to a linear variable gain IF amplifier 40 and then to a current driver 42 to drive a 50 ohm load.

Figure 2:
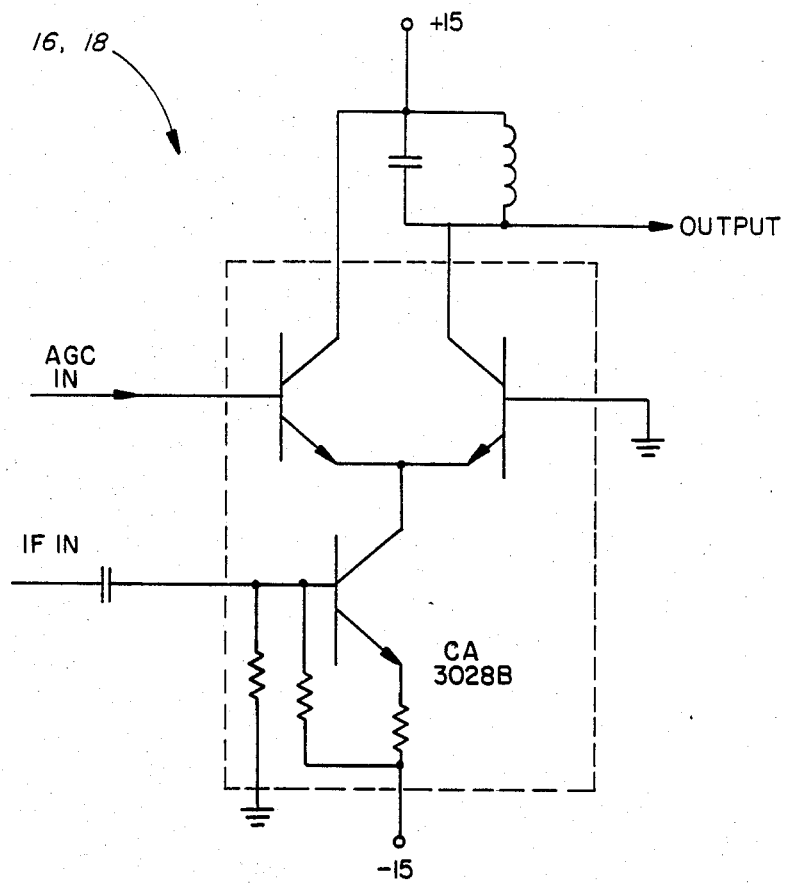
FIG. 2 is an exemplary circuit which can be utilized for the voltage control amplifiers of the constant rise AGC device.
Figure 3A:
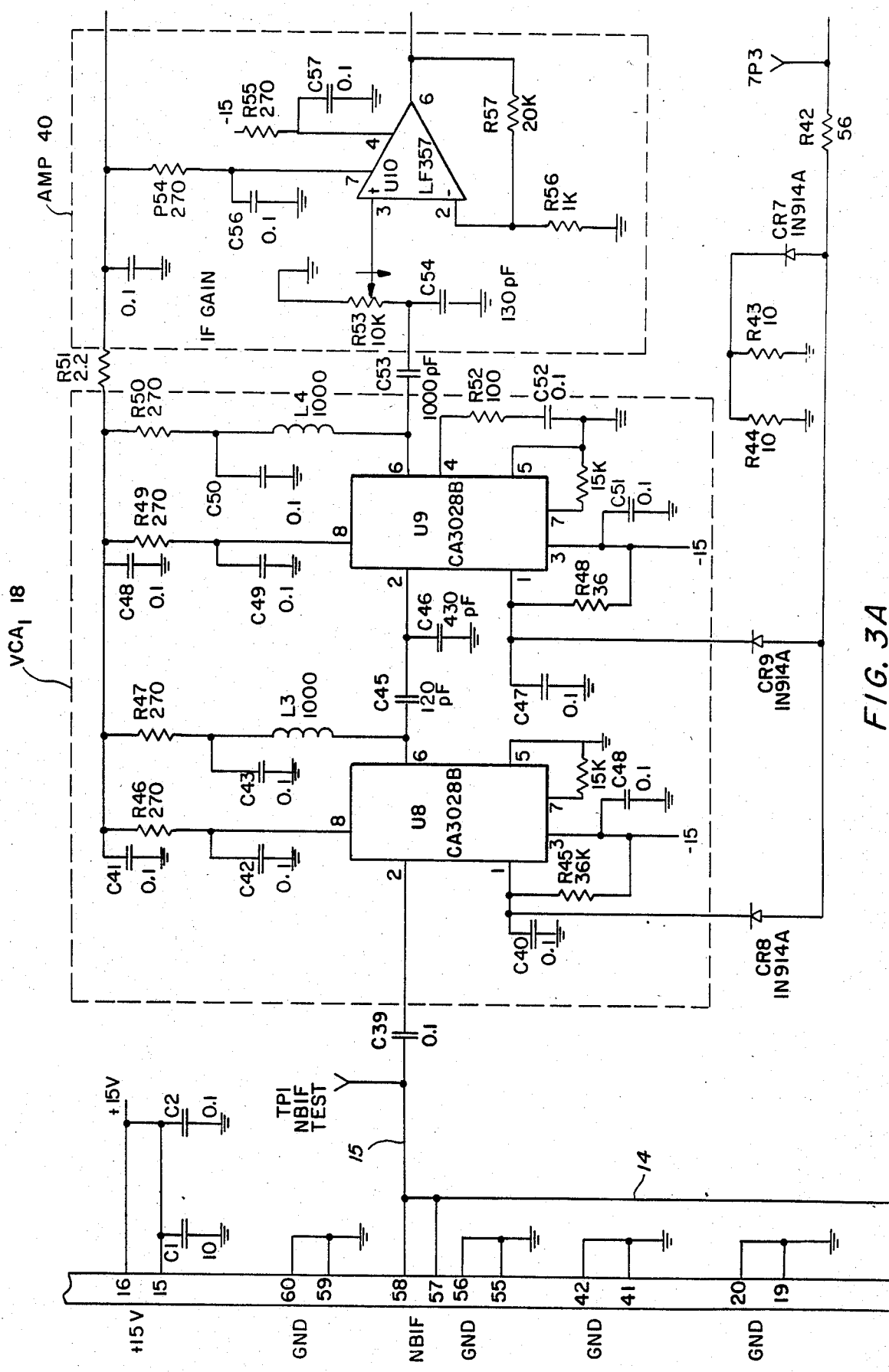
FIGS. 3A through 3D compose a diagram which details circuit components for the blocks illustrated in FIG. 1.
Figure 3B:
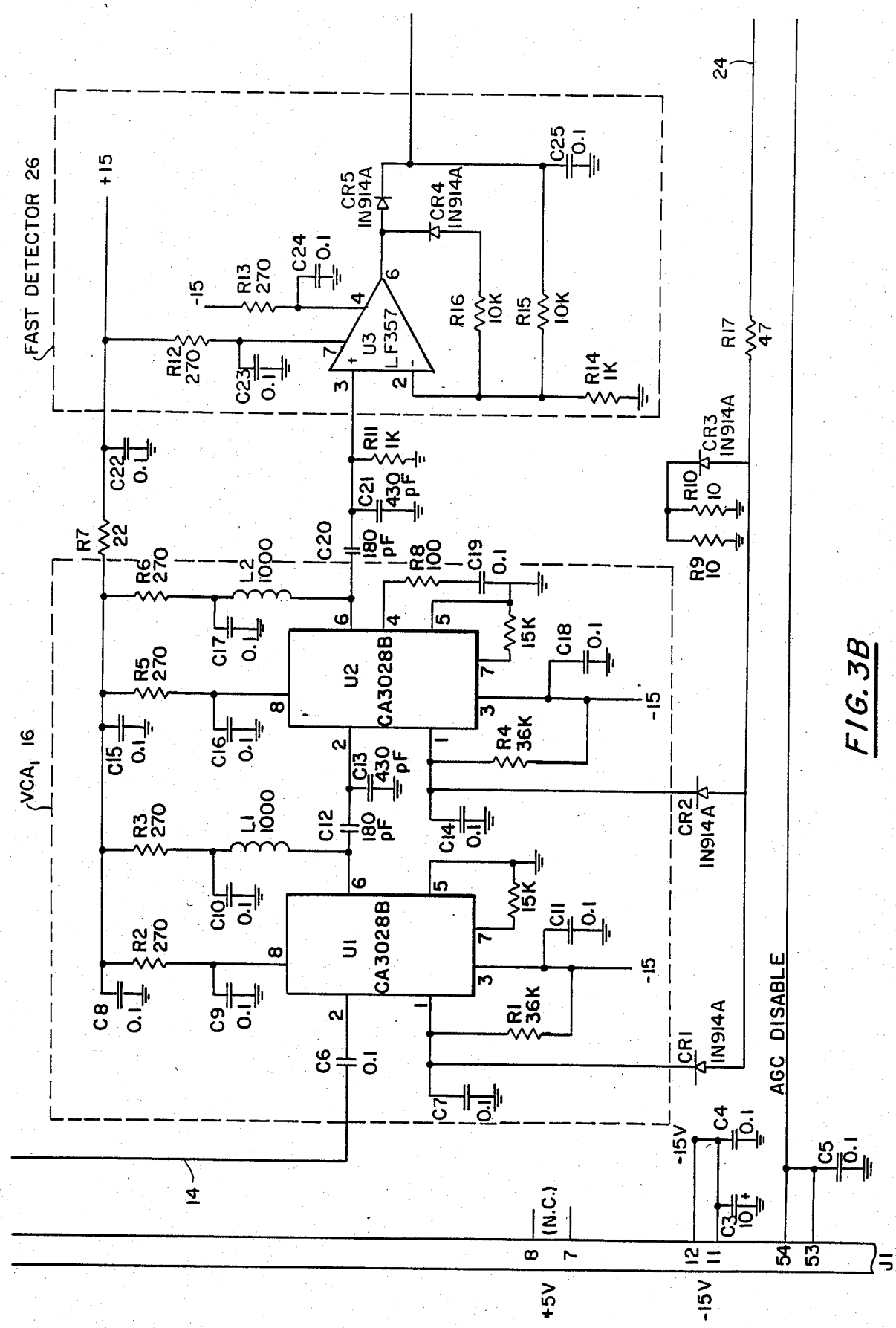
Figure 3C:
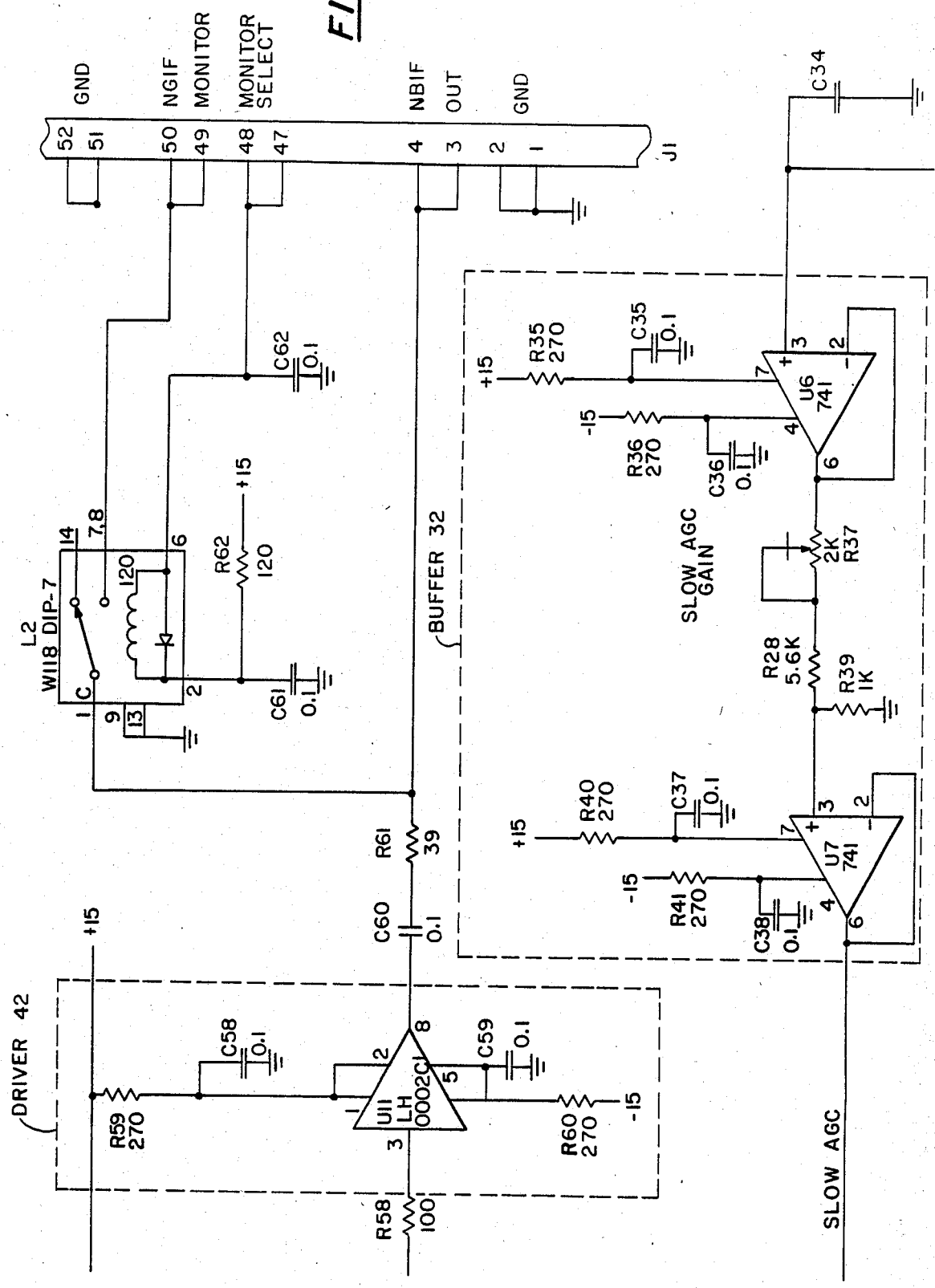
Figure 3D:
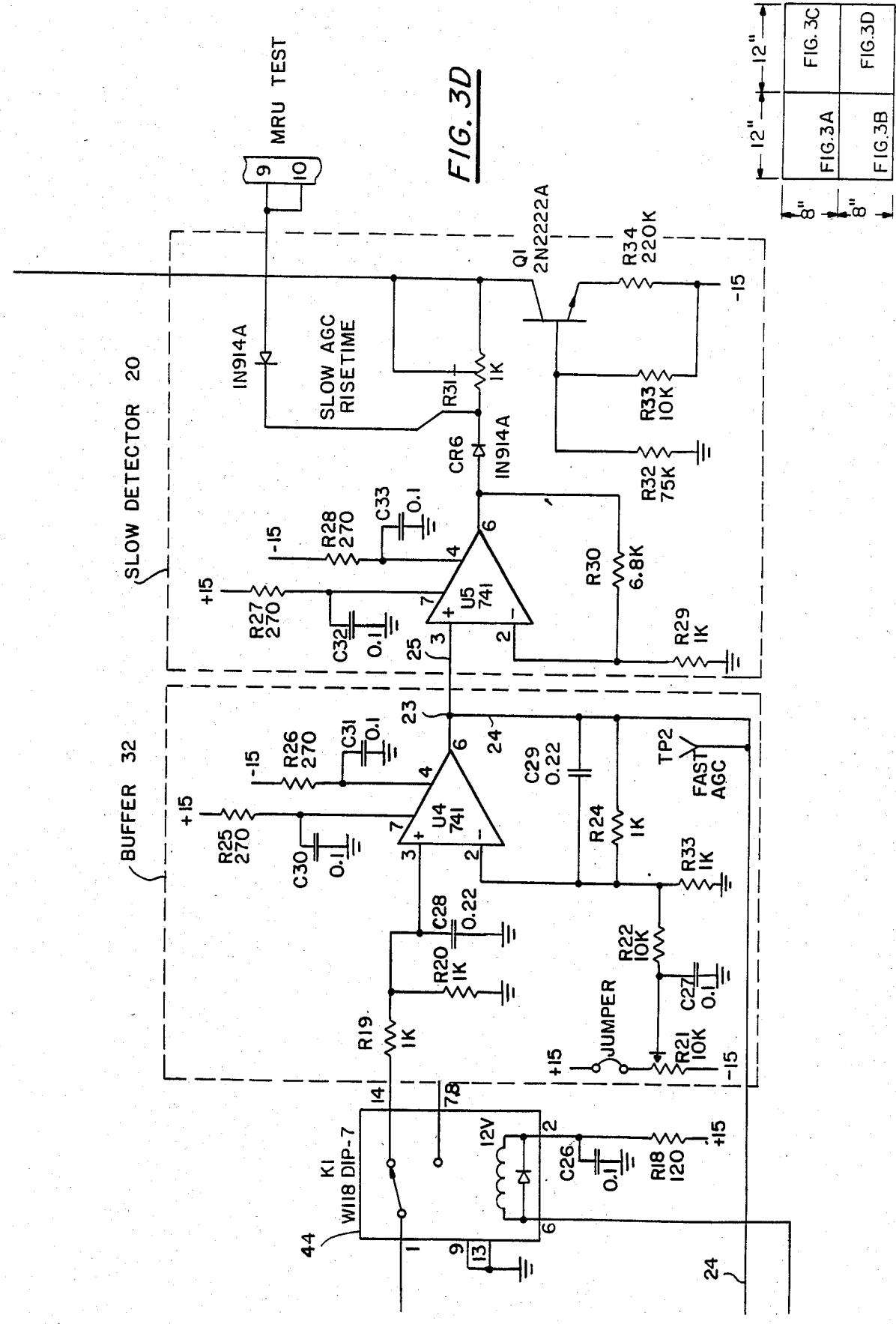

An exemplary circuit for each of the voltage control amplifiers 16 and 18 is illustrated in FIG. 2. FIGS. 3A-3D compose a complete diagram using some integrated circuits to satisfy all of the blocks in the block diagram of FIG. 1. Each of the voltage control amplifiers 16 and 18 may be provided with a pair of cascaded RCA CA3028B integrated circuit amplifiers as illustrated. It is to be understood that other gain control amplifiers could be utilized. The relay 44 may be provided for disabling the automatic gain control circuit.

OPERATION OF THE INVENTION

In essence the constant rise AGC device 10 is a pair of AGC loops 11 and 22, the loop 22 being within the larger loop 11 and providing a fast AGC, and the remainder of the larger loop 11 producing a slow AGC. The fast loop 22 is utilized to avoid saturation and the remainder of the slow (larger) loop 11 allows for optimized rise and fall times. More specifically the input signal 12 is split and provided to both the input voltage control amplifier 16 and the output voltage control amplifier 18. The output from the voltage control amplifier 16 is fed to the fast detector 26 which detector has a time constant which is faster than the rise time of IF filter 13 outputting the input signal 12. The output of the fast detector 26 is buffered by the buffer 32 and the resulting fast AGC signal is fed back via the lead 24 to control the gain of the voltage control amplifier 16. The fast detector 26 is fast enough so that the AGC action for the voltage control amplifier 16 is essentially instantaneous. This instantaneous action keeps the voltage control amplifier 16 from saturating with any input level over greater than a range such as 100 dB. The fast AGC peak level outputting at 23 is always directly log linearly related to the input signal 12. The fast AGC voltage at 23 is fed to the slow detector 20 which has the selectable AGC rise time governed at 36. The AGC rise and fall times can be optimized for the particular system and for the radio frequency environment that the device is to work in. In general the rise time will be somewhat slow, such as 5 milliseconds, to reduce the effects of interference bursts in the input signal 12, and at HF frequencies the slow AGC fall time will be long, such as 500 milliseconds, to maintain AGC between input signals 12, but yet fast enough to follow any signal fading. The slow AGC voltage from the detector 20 is then fed to the buffer amplifier 38 where there is the AGC gain control 39. The AGC gain control adjusts for differences in gain between the fast and slow AGC circuits 22 and 11, respectively, so that the two AGC voltages therefrom have substantially the same steady state AGC voltages and track each other. Consequently the slow AGC voltage controlling the gain of voltage conrol amplifier 18 is substantially the same level as the fast AGC voltage controlling the voltage control amplifier 16. Since the voltage control amplifiers 16 and 18 can be integrated circuits which are identical in all respects, their outputs, except for rise and fall times, are of identical amplitude. Therefore, for any input level of the signal 12 the output of the voltage control amplifier 18 will always rise to the steady state level in the same amount of time. This is a particularly valuable performance characteristic for short burst types of communications systems. The output of the voltage control amplifier 18 is then fed to the linear variable gain IF amplifier 40 and then to a current driver 42 to drive the 50 ohm load. The main advantage of the present invention is that the AGC voltage never saturates, thus permitting precise and constant AGC buildup for any input signal level.

Obviously many modifications and variations of the present invention are possible in the light of the above teachings. It is therefore to be understood that within the scope of the appended claims the invention may be practiced otherwise than as specifically described.

What is claimed is:
1. A constant rise AGC device comprising:
a primary AGC loop for receiving an input signal from an input terminal and splitting the input signal to input and output components of the primary AGC loop, the input signal to the input component being processed within the primary AGC loop to control the gain of the input signal at the output component of the primary AGC loop;
the primary AGC loop having slow detection means;
a secondary AGC loop within the primary AGC loop, the secondary AGC loop including said input component and having its output connected to the slow detection means; and
the secondary AGC loop having fast detection means for preventing self-imposed saturation;
whereby the secondary AGC loop can be utilized to provide a constant AGC buildup signal for any input signal greater than a predetermined dB range, and the remainder of the primary AGC loop, which receives the constant AGC buildup signal from the secondary AGC loop, can be optimized for desired rise and fall times so that the latter's output signal can be relatively unaffected by interference bursts, signal gaps and fading in the input signal.
2. A device as claimed in claim 1 including:
the primary AGC loop including a pair of voltage control amplifiers, one of said voltage control amplifiers being in the secondary AGC loop;
the voltage control amplifier of the secondary AGC loop being said input component of the primary AGC loop and the other voltage control amplifier being the output component of the primary AGC loop.
3. A device as claimed in claim 2 including:
the output of the fast detection means of the secondary AGC loop being fed back to the input voltage control amplifier and to said slow detection means.
4. A device as claimed in claim 3 including:
the voltage control amplifiers being identical integrated circuits.
5. A device as claimed in claim 4 including:
said slow detection means including means for controlling rise and fall times.
6. A device as claimed in claim 5 including:
the means for controlling rise and fall times of the slow detection means being adjusted for a rise time which reduces the effects of interference bursts in the input signal and being adjusted for a fall time which maintains AGC between signals but yet will follow input signal fading.

7. A device as claimed in claim 4 including:
a buffer between the slow detection means and the output voltage control amplifier; and
said buffer having means for controlling gain.

8. A device as claimed in claim 7 including:
the means for controlling gain being adjusted to equalize the levels of the voltages controlling the voltage control amplifiers.

9. A device as claimed in claim 8 including:
said slow detection means including means for controlling rise and fall times.

10. A device as claimed in claim 9 including:
the means for controlling rise and fall times of the slow detection means being adjusted for a rise time which reduces the effects of interference bursts in the input signal and being adjusted for a fall time which maintains AGC between signals but yet will follow input signal fading.

* * * * *